(12) United States Patent
Taniguchi (10) Patent No.: US 9,998,092 B2
(45) Date of Patent: Jun. 12, 2018

(54) ELASTIC WAVE DEVICE

(71) Applicant: Murata Manufacturing Co., Ltd., Nagaokakyo-shi, Kyoto-fu (JP)

(72) Inventor: Yasumasa Taniguchi, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 179 days.

(21) Appl. No.: 15/223,028

(22) Filed: Jul. 29, 2016

(65) Prior Publication Data

US 2016/0336919 A1 Nov. 17, 2016

Related U.S. Application Data

(63) Continuation of application No. PCT/JP2015/052432, filed on Jan. 29, 2015.

(30) Foreign Application Priority Data

Feb. 4, 2014 (JP) .................. 2014-019629

(51) Int. Cl.
*H03H 9/02* (2006.01)
*H03H 9/145* (2006.01)
*H03H 9/64* (2006.01)

(52) U.S. Cl.
CPC .... *H03H 9/02992* (2013.01); *H03H 9/02559* (2013.01); *H03H 9/14538* (2013.01); *H03H 9/14541* (2013.01); *H03H 9/6459* (2013.01)

(58) Field of Classification Search
CPC ........... H03H 9/02559; H03H 9/02992; H03H 9/14538; H03H 9/14541; H03H 9/6459

USPC ................................ 333/193–195; 310/313 B
See application file for complete search history.

(56) References Cited

U.S. PATENT DOCUMENTS

| 6,121,860 | A  | * | 9/2000  | Tsutsumi ............. | H03H 9/0028 310/313 D |
| 8,294,331 | B2 | * | 10/2012 | Abbott ............... | H03H 9/02858 29/25.35 |
| 2006/0244550 | A1 |  | 11/2006 | Inoue et al. | |
| 2007/0018755 | A1 |  | 1/2007  | Mayer et al. | |

(Continued)

FOREIGN PATENT DOCUMENTS

| CN | 1855713 A | 11/2006 |
| CN | 102684639 A | 9/2012 |

(Continued)

OTHER PUBLICATIONS

English translation of Official Communication issued in corresponding International Application PCT/JP2015/052432, dated Apr. 14, 2015.

*Primary Examiner* — Robert J Pascal
*Assistant Examiner* — Jorge Salazar, Jr.
(74) *Attorney, Agent, or Firm* — Keating & Bennett, LLP (57) ABSTRACT

An elastic wave device includes a first elastic wave resonator unit including a first IDT electrode and a second elastic wave resonator unit including a second IDT electrode and satisfies Wc<(Wa+Wb), where Wa is a dimension of a high acoustic velocity region on a first busbar side in a direction along which electrode fingers extend in the first IDT electrode, Wb is a dimension of a high acoustic velocity region on a fourth busbar side in the direction along which the electrode fingers extend in the second IDT electrode, and Wc is a dimension of an inter-stage connection portion.

20 Claims, 5 Drawing Sheets

(56) References Cited

U.S. PATENT DOCUMENTS

| | | |
|---|---|---|
| 2008/0315972 A1 | 12/2008 | Mayer et al. |
| 2011/0068655 A1 | 3/2011 | Solal et al. |
| 2012/0161577 A1 | 6/2012 | Abbott et al. |
| 2013/0051588 A1 | 2/2013 | Ruile et al. |

FOREIGN PATENT DOCUMENTS

| | | |
|---|---|---|
| CN | 102714490 A | 10/2012 |
| JP | 11-298286 A | 10/1999 |
| JP | 2003-347897 A | 12/2003 |
| JP | 2006-311180 A | 11/2006 |
| JP | 2007-507130 A | 3/2007 |
| JP | 2009-521142 A | 5/2009 |
| JP | 2011-101350 A | 5/2011 |
| JP | 2012-186808 A | 9/2012 |
| JP | 2013-518455 A | 5/2013 |

\* cited by examiner

ELASTIC WAVE DEVICE

CROSS REFERENCE TO RELATED APPLICATIONS

This application claims the benefit of priority to Japanese Patent Application 2014-019629 filed Feb. 4, 2014 and is a Continuation Application of PCT/JP2015/052432 filed on Jan. 29, 2015. The entire contents of each application are hereby incorporated by reference.

BACKGROUND OF THE INVENTION

1. Field of the Invention

The present invention relates to elastic wave devices for use in resonators, bandpass filters, and the like, and more particularly, to elastic wave devices that use piston modes.

2. Description of the Related Art

Japanese Unexamined Patent Application Publication No. 2011-101350 discloses an elastic wave device that uses a so-called piston mode. In Japanese Unexamined Patent Application Publication No. 2011-101350, the acoustic velocity at a top side portion of electrode fingers in an IDT electrode is lowered compared with the acoustic velocity in a cross-over portion of electrode fingers. This activates a piston mode and, as a result, can suppress ripples by a transverse mode.

Japanese Unexamined Patent Application Publication No. 2013-518455 also discloses an elastic wave device that uses a piston mode.

In transmission filters of cellular phones and the like, there is a need for enhancement of electric power handling capability, an improvement of IMD, and the like. To meet such needs, a resonator is often series-divided into multiple stages.

In the case that an elastic wave resonator described in Japanese Unexamined Patent Application Publication No. 2011-101350 is series-divided, there is a problem of increase in size in a direction orthogonal to an elastic wave propagation direction. Hereinafter, this problem is described with reference to FIG. 6.

Figure 6:
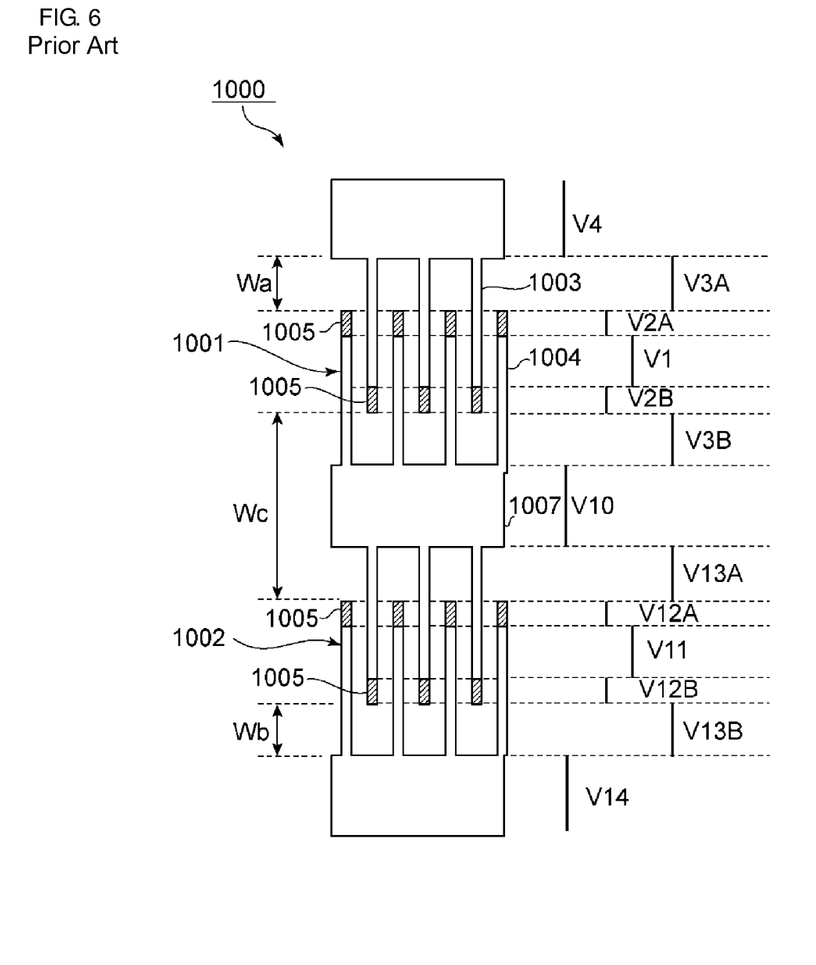
FIG. 6 is a schematic plan view depicting an electrode structure in which a prior art elastic wave resonator is series-divided.

FIG. 6 is a schematic plan view depicting an electrode configuration when the elastic wave device described in Japanese Unexamined Patent Application Publication No. 2011-101350 is series-divided. An elastic wave device 1000 is divided into a first elastic wave resonator unit including a first IDT electrode 1001 and an elastic wave resonator unit including a second IDT electrode 1002. In FIG. 6, a right side portion of the electrode configuration schematically illustrates acoustic velocities of elastic waves in respective regions. For example, the acoustic velocity in a center region of the first IDT electrode 1001 is V1, and the acoustic velocities in low acoustic velocity regions at both sides of the center region are V2A and V2B. The acoustic velocity is higher as the position of its indicator moves farther to the right.

An inter-stage busbar 1007 is disposed between the first IDT electrode 1001 and the second IDT electrode 1002, and this inter-stage busbar 1007 connects in series the first IDT electrode 1001 and the second IDT electrode 1002.

The regions of the acoustic velocities V2A and V2B, which are provided at both sides of the center region, are the low acoustic velocity regions. In the low acoustic velocity regions, an acoustic velocity lowering film 1005 is provided on electrode fingers 1003 and 1004. This slows down the acoustic velocity. The second IDT electrode 1002 has a configuration similar to the above.

As is evident from FIG. 6, a high acoustic velocity region whose acoustic velocity is V3B, the inter-stage busbar 1007, and a high acoustic velocity region whose acoustic velocity is V13A are needed in a portion connecting the first IDT electrode 1001 and the second IDT electrode 1002. In other words, the length of a dimension Wc in FIG. 6 needs to be made longer than a certain value. Thus, in the elastic wave device 1000, the dimension in a direction along which the electrode finger extends becomes longer, thereby making it difficult to downsize.

SUMMARY OF THE INVENTION

Preferred embodiments of the present invention provide an elastic wave device that uses a piston mode and is downsized.

An elastic wave device according to a preferred embodiment of the present invention includes a plurality of elastic wave resonator units formed by series-dividing an elastic wave resonator into a plurality of stages. The elastic wave device according to a preferred embodiment of the present invention includes a piezoelectric substrate; a first IDT electrode provided on the piezoelectric substrate and defining a first elastic wave resonator unit; a second IDT electrode provided on the piezoelectric substrate and defining a second elastic wave resonator unit that is connected in series to the first elastic wave resonator unit; and an inter-stage connection portion that connects the first elastic wave resonator unit and the second elastic wave resonator unit.

In a preferred embodiment of the present invention, the first IDT electrode includes a first busbar and a second busbar that is separated from the first busbar.

The first IDT electrode further includes a plurality of first electrode fingers that is electrically connected to the first busbar at base end portions thereof and extends toward a side of the second busbar, and a plurality of second electrode fingers that is connected to the second busbar at base end portions thereof and extends toward a side of the first busbar.

The second IDT electrode includes a third busbar and a fourth busbar that is separated from the third busbar. The second IDT electrode further includes a plurality of third electrode fingers that is electrically connected to the third busbar at base end portions thereof and extends toward a side of the fourth busbar, and a plurality of fourth electrode fingers that is connected to the fourth busbar at base end portions thereof and extends toward a side of the third busbar.

The first IDT electrode and the second IDT electrode are lined up in a direction along which the electrode finger extends with the inter-stage connection portion interposed therebetween.

In a preferred embodiment of the present invention, in each of the first IDT electrode and the second IDT electrode, a center region is provided at a center in the direction along which the electrode finger extends, low acoustic velocity regions whose elastic wave propagation velocities are lower than that of the center region are provided at both outer sides of the center region in the direction along which the electrode finger extends, and high acoustic velocity regions whose elastic wave propagation velocities are higher than that of the center region are provided at both outer sides of the low acoustic velocity regions in the direction along which the electrode finger extends. Furthermore, $Wc<(Wa+Wb)$ is satisfied, where Wa is a dimension of the high acoustic velocity region in the first IDT electrode on the side of the first busbar in the direction along which the electrode finger extends, Wb is a dimension of the high acoustic velocity region in the second IDT electrode on the side of the fourth busbar in the direction along which the electrode finger extends, and Wc is a dimension of the inter-stage connection portion in the direction along which the electrode finger extends.

In a particular aspect of an elastic wave device according to a preferred embodiment of the present invention, Wc<6λ is satisfied, where λ is a wavelength determined by electrode finger pitches in the first IDT electrode and the second IDT electrode.

In another particular aspect of an elastic wave device according to a preferred embodiment of the present invention, Wc<4λ is satisfied, where λ is a wavelength determined by the electrode finger pitches in the first IDT electrode and the second IDT electrode.

In still another particular aspect of an elastic wave device according to a preferred embodiment of the present invention, the second busbar of the first IDT electrode and the third busbar of the second IDT electrode share a common busbar.

In another particular aspect of an elastic wave device according to a preferred embodiment of the present invention, a plurality of apertures is provided in the common busbar and arranged along the elastic wave propagation direction, the high acoustic velocity region is provided in a region where the plurality of apertures are provided, elastic wave propagation velocity of the high acoustic velocity region being higher than that of the center region, and, within the common busbar, the low acoustic velocity regions are provided at both outer sides of the plurality of apertures in the direction along which the electrode finger extends.

In another particular aspect of an elastic wave device according to a preferred embodiment of the present invention, in the low acoustic velocity region, the first IDT electrode and the second IDT electrode are shaped to slow down the propagation velocity of elastic wave, compared with the propagation velocity of elastic wave in the center region.

In the elastic wave devices according to various preferred embodiments of the present invention, the relationship Wc<(Wa+Wb) is satisfied. This enables downsizing of the elastic wave device that uses a piston mode.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, the present invention is disclosed in detail by describing specific preferred embodiments thereof while referring to the drawings.

Figure 1:
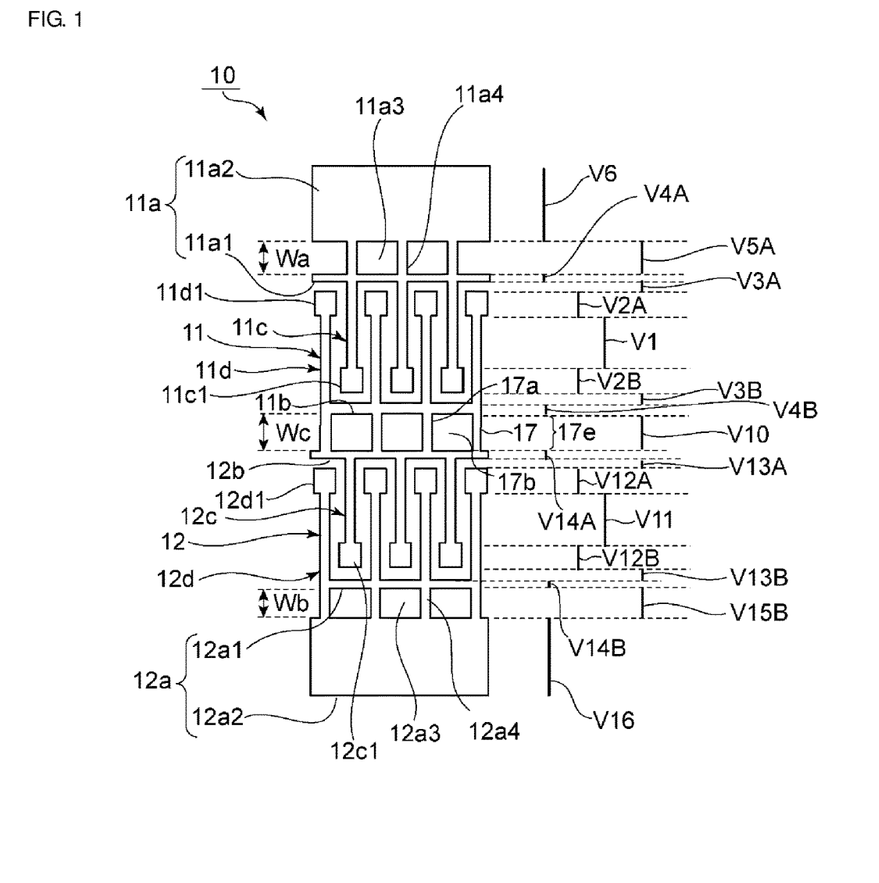
FIG. 1 is a schematic plan view depicting an electrode structure of an elastic wave device according to a first preferred embodiment of the present invention.
Figure 2:
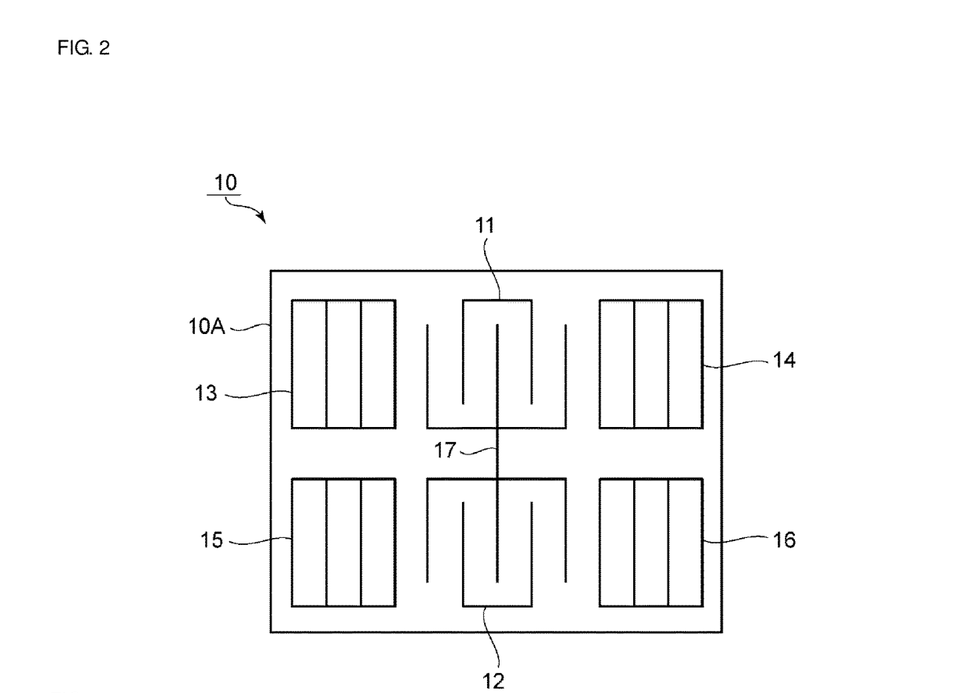
FIG. 2 is a simplified plan view of the elastic wave device according to the first preferred embodiment of the present invention.

FIG. 1 is a schematic plan view depicting an electrode structure of an elastic surface acoustic wave resonator that defines and functions as an elastic wave device according to the first preferred embodiment of the present invention. FIG. 2 is a plan view schematically depicting the entire elastic wave device according to the present preferred embodiment.

In an elastic wave device 10 depicted in FIG. 2, the depicted electrode structure is provided on a piezoelectric substrate composed of $LiTaO_3$, $LiNbO_3$, or the like. The electrode structure may be formed of a suitable metal such as, but not limited to, Al, Ag, Cu, Mo, Pt, Au, Ti, W, or an alloy. Alternatively, some of these metals may be stacked on top of another.

Specifically, a first IDT electrode 11 and a second IDT electrode 12 are provided on a piezoelectric substrate 10A. Reflectors 13 and 14 are provided on both sides of the first IDT electrode 11 in an elastic wave propagation direction. Similarly, reflectors 15 and 16 are provided on both sides of the second IDT electrode 12 in the elastic wave propagation direction. The first IDT electrode 11 and the reflectors 13 and 14 define a first elastic wave resonator unit. The IDT electrode 12 and the reflectors 15 and 16 define a second elastic wave resonator unit. In other words, the structure is provided in which a single elastic wave resonator is series-divided into two stages, the first elastic wave resonator unit and the second elastic wave resonator unit. This structure, in which a single elastic wave resonator is series-divided into a plurality of stages of elastic wave resonator units, enables improvements in electric power handling capability and an IMD characteristic.

In the elastic wave device 10 of the present preferred embodiment, it is possible to reduce the dimension of a portion connecting the IDT electrodes 11 and 12 with an inter-stage connection portion 17 interposed therebetween. Referring to FIG. 1, details are described. FIG. 1 is a plan view depicting details of the first IDT electrode 11, the second IDT electrode 12, and the inter-stage connection portion 17, which are depicted in FIG. 2 in a simple form.

As depicted in FIG. 1, the first IDT electrode 11 include a first busbar 11a and a second busbar 11b separated from the first busbar 11a. The first busbar 11a and the second busbar 11b extend in the elastic wave propagation direction. The first busbar 11a includes a plurality of apertures 11a3 arranged along the elastic wave propagation direction. Of the first busbar 11a, a portion closer to the second busbar 11b side than the plurality of apertures 11a3 is a busbar end portion 11a1. The busbar end portion 11a1 is connected to a busbar main portion 11a2 with linking portions 11a4 extending in a direction along which the electrode finger extends. The plurality of apertures 11a3 and the linking portions 11a4 together define a first busbar high acoustic velocity portion.

A plurality of first electrode fingers 11c is connected to the first busbar 11a at their base end portions. Each electrode finger 11c extends toward the second busbar 11b side.

A plurality of second electrode fingers 11d is connected to the second busbar 11b at their base end portions. Each second electrode finger 11d extends toward the first busbar 11a side.

The plurality of first electrode fingers 11c and the plurality of second electrode fingers 11d are inserted to each other in an interdigitated manner.

Furthermore, the first electrode finger 11c and the second electrode finger 11d have, on their top sides, wider width portions 11c1 and 11d1 in which the electrode finger widths are wider than their respective remaining portions.

The second IDT electrode 12 has a structure similar to the structure of the first IDT electrode 11. A plurality of third electrode fingers 12c and a plurality of fourth electrode fingers 12d are connected to a third busbar 12b and a fourth busbar 12a, respectively. The third electrode finger 12c has a wider width portion 12c1 at its top. The fourth electrode finger 12d has a wider width portion 12d1 at its top. The fourth busbar 12a includes, as is the case with the first busbar 11a, a busbar end portion 12a1 and a busbar main portion 12a2. Furthermore, a plurality of apertures 12a3 is provided. The busbar main portion 12a2 and the busbar end portion 12a1 are connected by a plurality of linking portions 12a4. The plurality of busbar apertures 12a3 and the plurality of linking portions 12a4 together define a second busbar high acoustic velocity portion.

The inter-stage connection portion 17 includes a plurality of linking portions 17a. The plurality of linking portions 17a preferably are integrally formed together with the first IDT electrode 11 and the second IDT electrode 12, for example, so as to define unitary member. Each linking portion 17a extends in the direction along which the electrode finger extends. Thus, in the elastic wave propagation direction, an aperture 17b is provided between adjacent linking portions 17a. The apertures 17b and the plurality of linking portions 17a together define a third busbar high acoustic velocity portion 17e. At the inter-stage between the first IDT electrode 11 and the second IDT electrode 12, the busbar high acoustic velocity portion is shared by the first IDT electrode 11 and the second IDT electrode 12.

Although not required, in the present preferred embodiment, the linking portion 17a preferably is an extension of the second electrode finger 11d. Whereas the linking portion 11a4 preferably is an extension of the first electrode finger 11c. However, the locations of the linking portions 17a and 11a4 are not limited thereto.

In FIG. 1, the right-hand side of the electrode structure illustrates propagation velocities of elastic waves in respective regions in the direction along which the electrode finger extends. In other words, in the right-hand side of FIG. 1, V1 to V16, which are represented as bold line segments extending in a longitudinal direction, each indicate the elastic wave propagation velocity at each region along the direction along which the electrode finger of the elastic wave device 10 extends. The acoustic velocity is higher as the position of the bold line segment moves farther to the right.

Specifically, in the first IDT electrode 11, the acoustic velocity is V1 at the center region in the direction along which the electrode finger extends. The center region is a region where the first electrode fingers 11c cross the second electrode fingers 11d.

Low acoustic velocity regions are provided at both outer sides of the center region in the direction along which the electrode finger extends. The acoustic velocities in these low acoustic velocity regions are V2A and V2B. The low acoustic velocity regions correspond to the portions where the foregoing wider width portions 11c1 and 11d1 are provided.

The wider width portions 11c1 and 11d1 slow the acoustic velocity down in a relative sense because of their shapes. In other words, in the present preferred embodiment, the shape of electrode finger is determined so as to provide the low acoustic velocity region in which the acoustic velocity is lower than the center region. Accordingly, the low acoustic velocity region may be easily formed only by modifying the shape at time of electrode patterning.

High acoustic velocity regions, in which the acoustic velocities are V3A and V3B, are provided at both outer sides of the foregoing low acoustic velocity regions in the direction along which the electrode finger extends. In each high acoustic velocity region, only the first electrode fingers 11c or only the second electrode fingers 11d are present along the elastic wave propagation direction.

In the busbar end portion 11a1 of the first busbar 11a, the elastic wave propagation velocity is V4A. This portion defines and functions as a low acoustic velocity region. In the portion where the apertures 11a3 are provided, the acoustic velocity is increased. This portion defines and functions as a high acoustic velocity region of V5A. The busbar main portion 11a2 is a low acoustic velocity region whose acoustic velocity is V6.

In the portion where the second busbar 11b is disposed, the acoustic velocity is V4B because of the presence of metal along the elastic wave propagation direction.

The second IDT electrode 12 is similarly structured. The inter-stage connection portion 17 defines and functions as a high acoustic velocity region whose acoustic velocity is V10 because of the presence of the plurality of linking portions 17a and the plurality of apertures 17b.

Similarly, in the second IDT electrode 12 side, the acoustic velocity in the center region is V11. At both sides of this center region, low acoustic velocity regions whose acoustic velocities are V12A and V12B are provided, and at both sides of these low acoustic velocity regions, there are high acoustic velocity regions whose acoustic velocities are V13A and V13B. The part where the third busbar 12b is disposed is a low acoustic velocity region, and the acoustic velocity therein is V14A. In the fourth busbar 12a, regions whose acoustic velocities are V14B, V15B, and V16 are lined up.

In the elastic wave device 10, as described above, the low acoustic velocity regions whose acoustic velocities are lower than that of the center region are provided at both sides of the center region, and furthermore, the high acoustic velocity regions are provided at both sides of these low acoustic velocity regions. In other words, a piston mode is being used. Therefore, transverse mode ripples are suppressed, and low-loss resonators are fabricated.

In addition, in the present preferred embodiment, the sum of a dimension Wa and a dimension Wb is greater than a dimension Wc in FIG. 1. Accordingly, the downsizing is achieved. The dimension Wa is the dimension of the high acoustic velocity region in the direction along which the electrode finger extends, which is provided on the first busbar 11a side of the first IDT electrode 11. The dimension Wb is the dimension of the high acoustic velocity region which is provided on the fourth busbar 12a side of the second IDT electrode 12, and the dimension Wc is the dimension of the inter-stage connection portion 17 in the direction along which the electrode finger extends. Furthermore, the dimension Wc is greater than the dimension Wa or the dimension Wb. In the elastic wave device 10 according to the present preferred embodiment, as described in the above, the dimension of the inter-stage connection portion 17 in the direction along which the electrode finger extends is able to be made smaller, compared with the elastic wave device 1000 depicted in FIG. 6. Accordingly, the downsizing of the elastic wave device 10 is achieved. Furthermore, degradation of electrical characteristics hardly occurs, as indicated in the following experimental examples.

Figure 3:
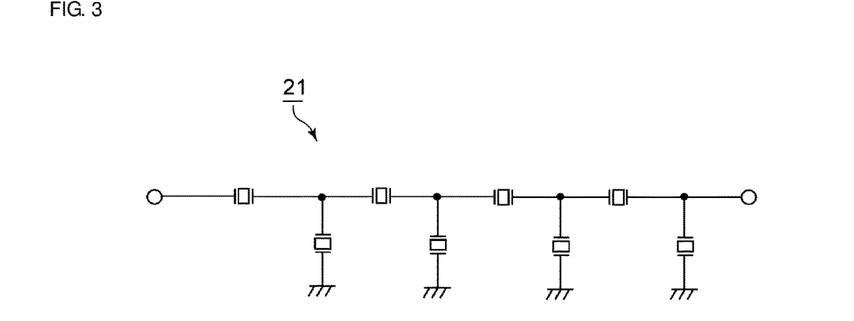
FIG. 3 is a circuit diagram of a bandpass filter including an elastic wave device according to the first preferred embodiment of the present invention.

FIG. 3 is a circuit diagram of a bandpass filter including the elastic wave device according to the foregoing preferred embodiment of the present invention. A bandpass filter 21 depicted in FIG. 3 has a ladder circuit configuration.

Figure 4:
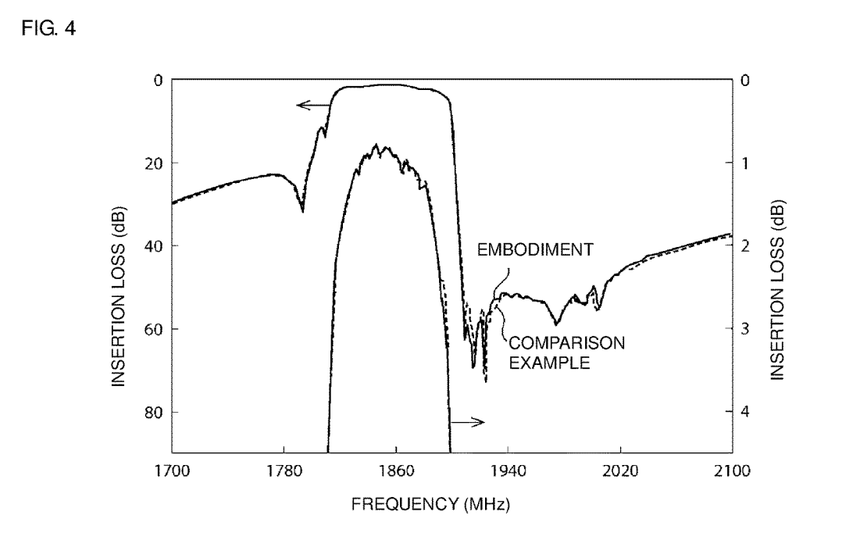
FIG. 4 is a diagram depicting attenuation-frequency characteristics of an exemplary bandpass filter according to the first preferred embodiment of the present invention and a bandpass filter of a comparison example.

In FIG. 4, an attenuation-frequency characteristic of a ladder filter using an elastic surface acoustic wave resonator according to the present preferred embodiment is indicated by the solid line. The dashed line in FIG. 4 indicates an attenuation-frequency characteristic of a bandpass filter configured in a manner similar to the foregoing example except that the structure depicted in FIG. 6 is used therein.

As is evident from FIG. 4, compared with the comparison example, there is hardly any degradation in the filter characteristic of the example. With series-divided multiple-stage structures, the elastic wave device 10 enables the reduction of about 10% to about 20% in the dimension in the direction along which the electrode finger extends, compared with the comparison example in FIG. 6. Accordingly, the downsizing of an elastic wave resonator or a filter device using an elastic wave resonator is able to be achieved without degrading the filter characteristic.

Typically, in an elastic wave resonator using a piston mode, a high acoustic velocity region needs to be provided at an outer side of a center region, and furthermore, the dimension of the high acoustic velocity region in a direction along which electrode fingers extend needs to be at least about 2λ or more, preferably about 3λ or more, in order to maintain Q of the resonator. Thus, in the case with a divided two-stage structure, it is preferable to provide high acoustic velocity regions whose dimensions are each equal to about 2λ or more, or about 3λ or more, at both sides of the inter-stage portion. Accordingly, in the elastic wave device 1000 depicted in FIG. 6, the dimension of the inter-stage connection portion becomes about 4λ or more, or about 6λ or more. Here, λ is a wavelength of elastic wave determined by electrode finger pitches of the first IDT electrode 11 and the second IDT electrode 12.

As described above, the inventors of preferred embodiments of the present invention discovered that, with the series-divided multiple-stage structure, the filter characteristic was hardly degraded even when the dimension Wc of the inter-stage connection portion 17 was reduced, and achieved the preferred embodiments of the present invention. In the prior art, it is considered that the dimension of the high acoustic velocity region needs to be increased in the case where a piston mode is used with the series-divided multiple-stage structure. This makes it difficult to achieve the downsizing in the prior art.

According to the elastic wave device 10 of the foregoing preferred embodiment, Wc may be made smaller than about 6λ, preferably Wc<4λ.

Figure 5:
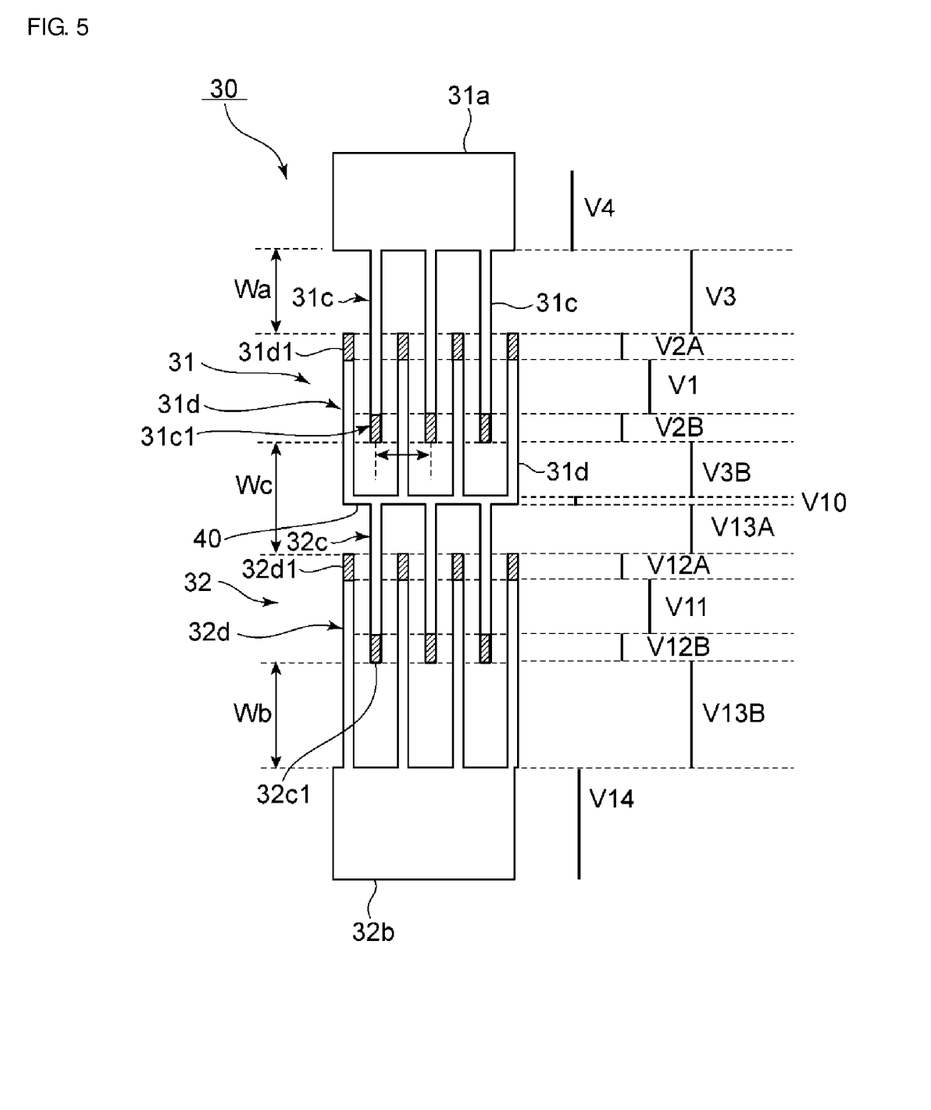
FIG. 5 is a plan view depicting an electrode structure of an elastic wave device according to a second preferred embodiment of the present invention.

FIG. 5 is a plan view depicting a main portion of an electrode structure of an elastic wave device according to a second preferred embodiment of the present invention. An elastic wave device 30 of the second preferred embodiment includes a first IDT electrode 31 and a second IDT electrode 32. The first IDT electrode 31 includes a first busbar 31a. A common busbar 40 is separated from the first busbar 31a. The common busbar 40 is a common portion shared by a second busbar and a third busbar of the second IDT electrode 32. In other words, in the present preferred embodiment, the second busbar and the third busbar share the common busbar 40.

A plurality of first electrode fingers 31c is connected to the first busbar 31a. A plurality of second electrode fingers 31d is connected to the common busbar 40. A top portion of the electrode finger 31c is covered with an acoustic velocity lowering film 31c1. Similarly, a top portion of the electrode finger 31d is covered with an acoustic velocity lowering film 31d1. As is the case with the first preferred embodiment, this defines a center region whose acoustic velocity is V1 at a center of an electrode finger cross-over portion, and at both sides of this center region, low acoustic velocity regions whose acoustic velocities are V2A and V2B are provided.

High acoustic velocity regions, in each of which only the electrode fingers 31c or only the electrode fingers 31d are present, are provided at both sides of the low acoustic velocity regions in the direction along which the electrode finger extends. In other words, the high acoustic velocity regions whose acoustic velocities are V3 and V3B are provided. The busbar 31a defines and functions as a low acoustic velocity region and has an acoustic velocity of V4.

In the second IDT electrode 32, a fourth busbar 32b is separated from the common busbar 40. A plurality of third electrode fingers 32c is connected to the common busbar 40. A plurality of fourth electrode fingers 32d is connected to the fourth busbar 32b. Top portions of the third electrode finger 32c and the fourth electrode finger 32d are also covered with acoustic velocity lowering films 32c1 and 32d1, respectively. This structure provides low acoustic velocity regions whose acoustic velocities are V12A and V12B at both sides of a center region whose acoustic velocity is V11. Furthermore, high acoustic velocity regions whose acoustic velocities are V13A and V13B are provided at both outer sides of the low acoustic velocity regions whose acoustic velocities are V12A and V12B. The busbar 32b defines and functions as a low acoustic velocity region whose acoustic velocity is V14.

The common busbar 40 is made of a metal and defines a low acoustic velocity region whose acoustic velocity is V10.

In the present preferred embodiment, the dimension Wc is also less than the sum of the dimension Wa and the dimension Wb, thus making it possible to achieve the downsizing.

As in the present preferred embodiment, the second busbar and the third busbar may share the common busbar 40. This enables further downsizing. Furthermore, as described above, the low acoustic velocity region including the common busbar 40 may be provided between the first elastic wave resonator and the high acoustic velocity region of the second elastic wave resonator on the side closer to the inter-stage connection portion.

The present invention is not limited to the series-divided two-stage structure and may also be applicable to elastic wave resonators having structures that include series-divided three or more stages. Furthermore, the elastic wave is not limited to an elastic surface acoustic wave, and a boundary acoustic wave may also be used.

Furthermore, the filter devices according to preferred embodiments of the present invention are not limited to the ones having a ladder circuit configuration depicted in FIG. 3, and the present invention is applicable to filter devices using various elastic wave resonators.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An elastic wave device including a plurality of elastic wave resonator units defined by a series-divided elastic wave resonator including a plurality of stages, the elastic wave device comprising:
   a piezoelectric substrate;
   a first IDT electrode provided on the piezoelectric substrate and defining a first elastic wave resonator unit;
   a second IDT electrode provided on the piezoelectric substrate and defining a second elastic wave resonator unit that is connected in series to the first elastic wave resonator unit; and
   an inter-stage connection portion that connects the first elastic wave resonator unit and the second elastic wave resonator unit; wherein
   the first IDT electrode includes:
      a first busbar;
      a second busbar separated from the first busbar;
      a plurality of first electrode fingers that is electrically connected to the first busbar at base end portions thereof and extends toward a side of the second busbar; and
      a plurality of second electrode fingers that is connected to the second busbar at base end portions thereof and extends toward a side of the first busbar; wherein
   the second IDT electrode includes:
      a third busbar;
      a fourth busbar separated from the third busbar;
      a plurality of third electrode fingers that is electrically connected to the third busbar at base end portions thereof and extends toward a side of the fourth busbar; and
      a plurality of fourth electrode fingers that is connected to the fourth busbar at base end portions thereof and extends toward a side of the third busbar; wherein
   the first IDT electrode and the second IDT electrode are lined up in a direction along which the electrode finger extends with the inter-stage connection portion interposed therebetween;
   in each of the first IDT electrode and the second IDT electrode, a center region is provided at a center in the direction along which the electrode finger extends, low acoustic velocity regions with elastic wave propagation velocities lower than those of the center region are provided at both outer sides of the center region in the direction along which the electrode finger extends, and high acoustic velocity regions with elastic wave propagation velocities higher than those of the center region are provided at both outer sides of the low acoustic velocity regions in the direction along which the electrode finger extends; and
   $Wc<(Wa+Wb)$ is satisfied, where Wa is a dimension of the high acoustic velocity region in the first IDT electrode on the side of the first busbar in the direction along which the electrode finger extends, Wb is a dimension of the high acoustic velocity region in the second IDT electrode on the side of the fourth busbar in the direction along which the electrode finger extends, and Wc is a dimension of the inter-stage connection portion in the direction along which the electrode finger extends.

2. The elastic wave device according to claim 1, wherein $Wc<6\lambda$ is satisfied, where $\lambda$ is a wavelength determined by electrode finger pitches in the first IDT electrode and the second IDT electrode.

3. The elastic wave device according to claim 1, wherein $Wc<4\lambda$ is satisfied, where $\lambda$ is a wavelength determined by the electrode finger pitches in the first IDT electrode and the second IDT electrode.

4. The elastic wave device according to claim 1, wherein the second busbar of the first IDT electrode and the third busbar of the second IDT electrode share a common busbar.

5. The elastic wave device according to claim 4, wherein
   a plurality of apertures is provided in the common busbar and arranged along the elastic wave propagation direction;
   the high acoustic velocity region is provided in a region where the plurality of apertures are provided, elastic wave propagation velocity of the high acoustic velocity region being higher than that of the center region; and
   within the common busbar, the low acoustic velocity regions are provided at both outer sides of the plurality of apertures in the direction along which the electrode finger extends.

6. The elastic wave device according to claim 4, further comprising an acoustic velocity lowering film provided on the first electrode fingers.

7. The elastic wave device according to claim 4, further comprising an acoustic velocity lowering film provided on the second electrode fingers.

8. The elastic wave device according to claim 4, further comprising an acoustic velocity lowering film provided on the third electrode fingers.

9. The elastic wave device according to claim 4, further comprising an acoustic velocity lowering film provided on the fourth electrode fingers.

10. A bandpass filter comprising the elastic wave device according to claim 4.

11. The elastic wave device according to claim 1, wherein in the low acoustic velocity region, the first IDT electrode and the second IDT electrode are shaped to slow down the propagation velocity of elastic wave, compared with the propagation velocity of elastic wave in the center region.

12. The elastic wave device according to claim 1, wherein the first electrode fingers and the second electrode fingers include on top sides thereof wider width portions in which an electrode finger widths are wider than respective remaining portions.

13. The elastic wave device according to claim 1, wherein the third electrode fingers and the fourth electrode fingers include on top sides thereof wider width portions in which an electrode finger widths are wider than respective remaining portions.

14. The elastic wave device according to claim 1, wherein the inter-stage connection portion includes a plurality of linking portions.

15. The elastic wave device according to claim 14, wherein the plurality of linking portions are integral to define a unitary member.

16. The elastic wave device according to claim 14, wherein the plurality of linking portions extends in the direction along which the electrode fingers extend.

17. The elastic wave device according to claim 14, wherein an aperture is located between respective pairs of the apertures.

18. The elastic wave device according to claim 14, wherein at least one of the plurality of linking portions is an extension of the first electrode finger and at least another one of the plurality of linking portions is an extension of the second electrode finger.

19. The elastic wave device according to claim 1, wherein the elastic wave device has a structure that uses a piston mode.

20. A bandpass filter comprising the elastic wave device according to claim 1.

\* \* \* \* \*